(12) United States Patent
Luo et al.

(10) Patent No.: US 8,243,466 B2
(45) Date of Patent: Aug. 14, 2012

(54) PRINTED CIRCUIT BOARD

(75) Inventors: Shi-Piao Luo, Shenzhen (CN); Chia-Nan Pai, Taipei Hsien (TW); Shou-Kuo Hsu, Taipei Hsien (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/872,652

(22) Filed: Aug. 31, 2010

(65) Prior Publication Data

US 2012/0026707 A1    Feb. 2, 2012

(30) Foreign Application Priority Data

Aug. 2, 2010    (CN) .......................... 2010 1 0242441

(51) Int. Cl.
*H05K 7/00* (2006.01)

(52) U.S. Cl. ........ 361/782; 361/763; 361/766; 361/767; 174/260; 257/678

(58) Field of Classification Search ................. 361/782, 361/767, 777, 766; 174/254, 255, 261, 260; 257/678

See application file for complete search history.

(56) References Cited

U.S. PATENT DOCUMENTS

| | | | | |
|---|---|---|---|---|
| 5,039,824 A | * | 8/1991 | Takashima et al. | 174/33 |
| 2002/0118523 A1 | * | 8/2002 | Okabe et al. | 361/793 |
| 2010/0012363 A1 | * | 1/2010 | Chen et al. | 174/260 |
| 2011/0147070 A1 | * | 6/2011 | Mcilquham et al. | 174/266 |

* cited by examiner

*Primary Examiner* — Yuriy Semenenko
*Assistant Examiner* — Andargie M Aychillhum
(74) *Attorney, Agent, or Firm* — Altis Law Group, Inc.

(57) ABSTRACT

A printed circuit board includes first and second layers, a control chip, bonding pads, and several electronic elements. The bonding pads can be selectively applied to interconnect the first and second layers, and the control chip with any of the electronic elements in a simple layout.

5 Claims, 3 Drawing Sheets

PRINTED CIRCUIT BOARD

BACKGROUND

1. Technical Field

The present disclosure relates to a printed circuit board (PCB).

2. Description of Related Art

PCBs can be found in most electronic devices and must be able to support transmission of high-speed differential signals. If high-speed differential signals are transmitted to at least three electronic elements, laying out signal lines of the PCBs becomes overly complicated and may lead to design flaws affecting performance of the PCBs.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
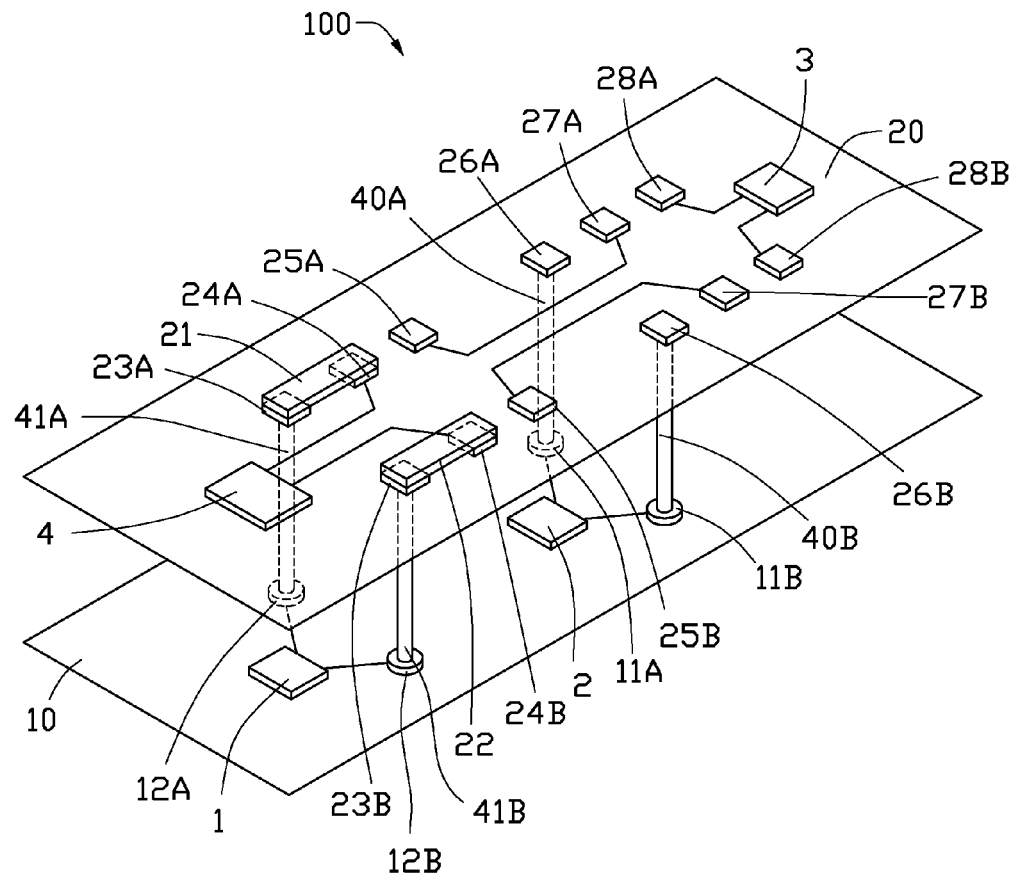
FIG. 1 is a schematic diagram of an exemplary embodiment of a printed circuit board connected to a first electronic element.

Referring to FIG. 1, an exemplary embodiment of a printed circuit board (PCB) 100 includes a first signal layer 10, a second signal layer 20, an insulation layer (omitted to provide clear view of connections between layers 10 and 20) located between the first and second signal layers 10 and 20, a pair of first vias 40A and 40B, a pair of second vias 41A and 41B, and a control chip 4. The first vias 40A and 40B, and the second vias 41A and 41B extend through the first signal layer 10, the insulation layer, and the second signal layer 20.

A pair of first bonding pads 11A and 11B and a pair of second bonding pads 12A and 12B are mounted on the first signal layer 10, and electrically connected to the pair of first vias 40A and 40B, and the pair of second vias 41A and 41B. The second bonding pads 12A and 12B are connected to a first electronic element 1. The first bonding pads 11A and 11B are connected to a second electronic element 2.

A pair of third bonding pads 23A and 23B, a pair of fourth bonding pads 24A and 24B, a pair of fifth bonding pads 25A and 25B, a pair of sixth bonding pads 26A and 26B, a pair of seventh bonding pad 27A and 27B, and a pair of eighth bonding pads 28A and 28B are mounted on the second signal layer 20. The fourth bonding pads 24A and 24B are mounted between the third bonding pads 23A and 23B and the fifth bonding pads 25A and 25B. The third bonding pads 23A and 23B are connected to the second bonding pads 12A and 12B by the second vias 41A and 41B. The seventh bonding pads 27A and 27B are mounted between the sixth bonding pads 26A and 26B and the eighth bonding pads 28A and 28B. The seventh bonding pads 27A and 27B are connected to the fifth bonding pads 25A and 25B. The sixth bonding pads 26A and 26B are connected to the first bonding pads 11A and 11B by the first vias 40A and 40B. The fourth bonding pads 24A and 24B are connected to the control chip 4 for transmission of a pair of high-speed signals therethrough such as a pair of differential signals from the control chip 4. The eighth bonding pads 28A and 28B are connected to a third electronic element 3.

When the control chip 4 transmits the pair of high speed signals to the first electronic element 1, a first passive element 21 is used to connect the third bonding pads 23A to the fourth bonding pad 24A. A second passive element 22 is used to connect the third bonding pads 23B to the fourth bonding pad 24B. The control chip 4 outputs the pair of high-speed signals to the first electronic element 1 through the fourth bonding pads 24A and 24B, the first and second passive elements 21 and 22, the third bonding pads 23A and 23B, the second vias 41A and 41B, and the second bonding pads 12A and 12B.

Figure 2:
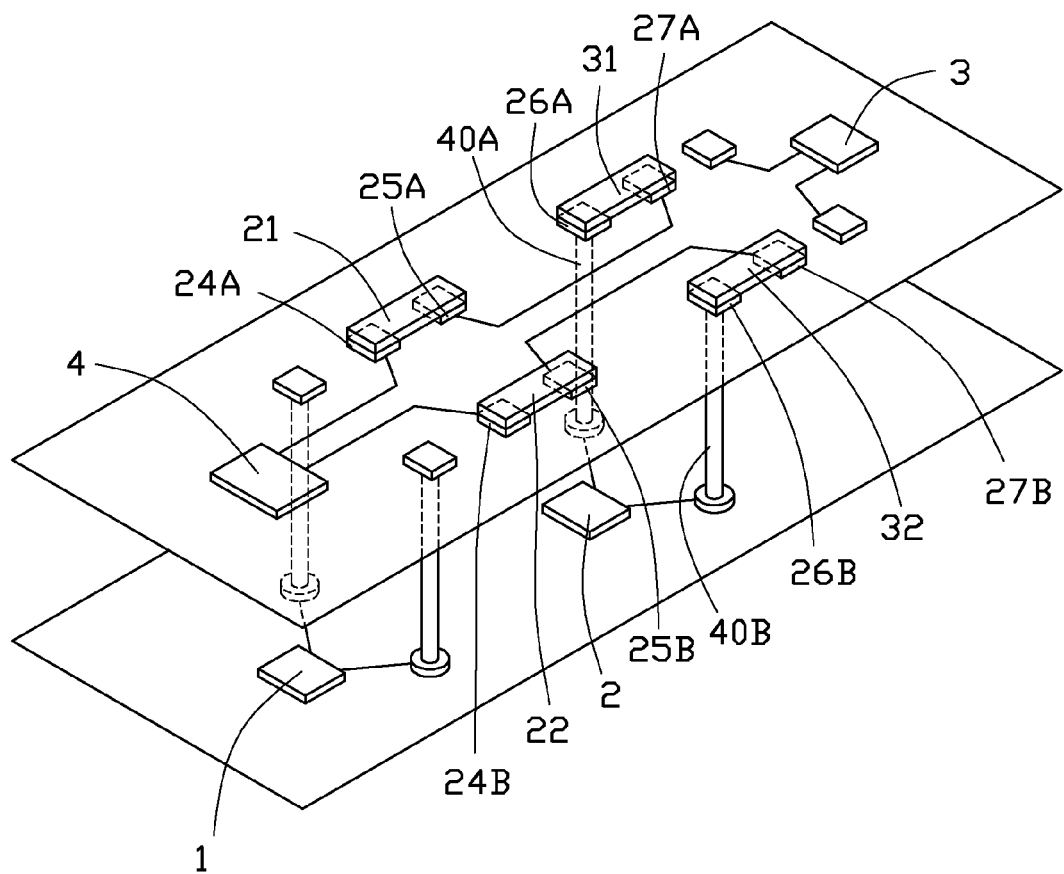
FIG. 2 is similar to FIG. 1, but showing a second electronic element connected.

Referring to FIG. 2, when the control chip 4 transmits the pair of high-speed signals to the second electronic element 2, the first passive element 21 is used to connect the fourth bonding pads 24A to the fifth bonding pad 25A. The second passive element 22 is used to connect the fourth bonding pad 24B and to the fifth bonding pad 25B. A third passive element 31 is used to connect the sixth bonding pads 26A to the seventh bonding pad 27A. A fourth passive element 32 is used to connect the sixth bonding pads 26B to the seventh bonding pad 27B. The control chip 4 outputs the pair of high-speed signals to the second electronic element 2 through the fourth bonding pads 24A and 24B, the first and second passive elements 21 and 22, the fifth bonding pads 25A and 25B, the seventh bonding pads 27A and 27B, the third and fourth passive elements 31 and 32, the sixth bonding pads 26A and 26B, the first vias 40A and 40B, and the first bonding pads 11A and 11B.

Figure 3:
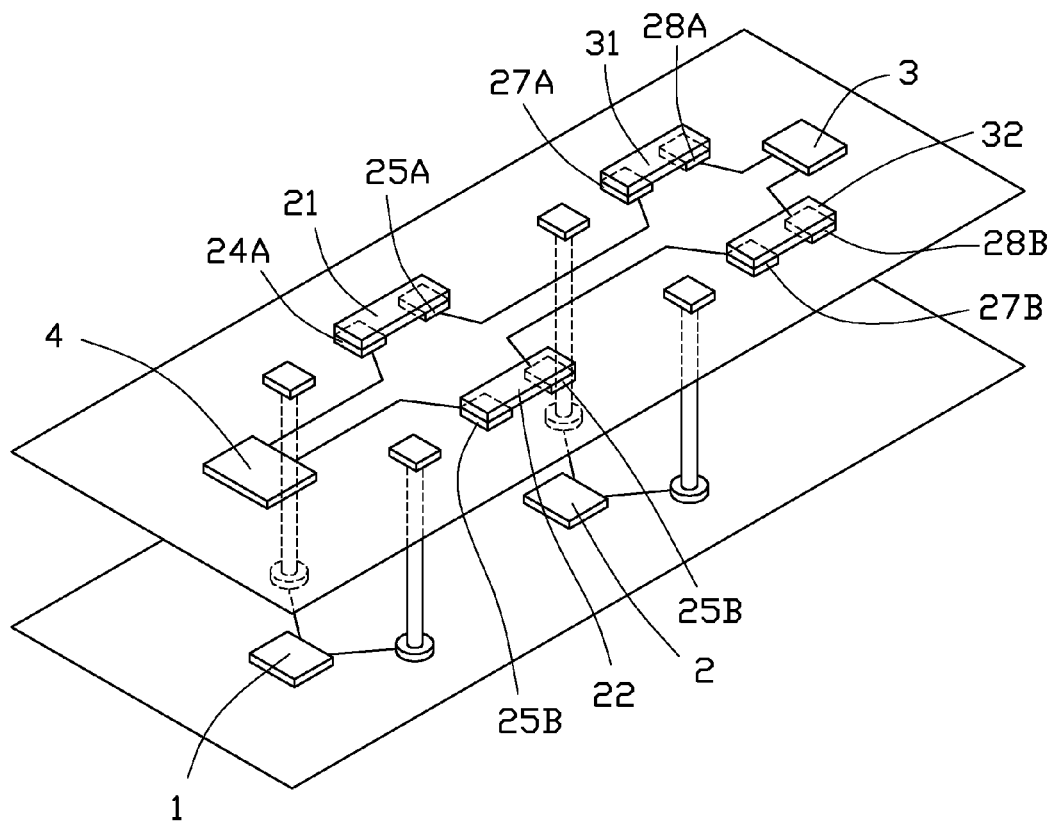
FIG. 3 is similar to FIG. 1, but showing a third electronic element connected.

Referring to FIG. 3, when the control chip 4 transmits the pair of high-speed signals to the third electronic element 3, the first passive element 21 is used to connect the fourth bonding pads 24A to the fifth bonding pad 25A. The second passive element 22 is used to connect the fourth bonding pads 24B to the fifth bonding pad 25B. The third passive element 31 is used to connect the seventh bonding pads 27A to the eighth bonding pad 28A. The fourth passive element 32 is used to connect the seventh bonding pads 27B to the eighth bonding pad 28B. The control chip 4 outputs the pair of high-speed signals to the third electronic element 3 through the fourth bonding pads 24A and 24B, the first and second passive elements 21 and 22, the fifth bonding pads 25A and 25B, the seventh bonding pads 27A and 27B, the third and fourth passive elements 31 and 32, and the eighth bonding pads 28A and 28B. In the embodiment, the first passive element 21 aligns with the second passive element 22. The third passive element 31 aligns with the fourth passive element 32. The first to fourth passive elements 21, 22, 31, and 32 may be resistors.

It is to be understood, however, that even though numerous characteristics and advantages of the present disclosure have been set forth in the foregoing description, together with details of the structure and function of the disclosure, the disclosure is illustrative only, and changes may be made in details, especially in matters of shape, size, and arrangement of parts within the principles of the disclosure to the full extent indicated by the broad general meaning of the terms in which the appended claims are expressed.

What is claimed is:

1. A printed circuit board (PCB) comprising:
a first signal layer, wherein a pair of first bonding pads are mounted on the first signal layer and connected to a first electronic element, and a pair of second bonding pads are mounted on the first signal layer and connected to a second electronic element;
a second signal layer, wherein a pair of third bonding pads, a pair of fourth bonding pads, a pair of fifth bonding pads, a pair of sixth bonding pads, a pair of seventh bonding pads, and a pair of eighth bonding pads are mounted on the second signal layer, the fourth bonding pads are located between the third bonding pads and the fifth bonding pads, the third bonding pads are connected to the second bonding pads of the first signal layer, the seventh bonding pads are located between the sixth bonding pads and the eighth bonding pads and connected to the fifth bonding pads, the sixth bonding pads are connected to the first bonding pads, the eighth bonding pads are connected to a third electronic element; and
a control chip connected to the fourth bonding pads to transmit a pair of signals;
wherein when the third bonding pads are connected to the fourth bonding pads, the pair of signals are transmitted to the second electronic element, when the fourth bonding pads are connected to the fifth bonding pads, the pair of signals are transmitted to the first electronic element, when the fourth bonding pads are connected to the fifth bonding pads, and the seventh bonding pads are connected to the eighth bonding pads, the pair of signals are transmitted to the third electronic element.

2. The PCB of claim 1, further comprising:
a pair of first vias connecting the third bonding pads to the second bonding pads; and
a pair of second vias connecting the sixth bonding pads to the first bonding pads.

3. The PCB of claim 1, wherein when the pair of signals are transmitted to the second electronic element, the third bonding pads are connected to the fourth bonding pads by first and second passive elements; when the pair of signals are transmitted to the first electronic element, the fourth bonding pads are connected to the fifth bonding pads by third and fourth passive elements, the sixth bonding pads are connected to the seventh bonding pads by fifth and sixth passive elements; when the pair of signals are transmitted to the third electronic element, the fourth bonding pads are connected to the fifth bonding pads by seventh and eighth passive elements, the seventh bonding pads are connected to the eighth bonding pads by ninth and tenth passive elements.

4. The PCB of claim 3, wherein the first to tenth passive elements are resistors.

5. The PCB of claim 1, wherein the pair of signals from the control chip is a pair of high speed differential signals.

* * * * *